(12) United States Patent
Lee et al.

(10) Patent No.: US 9,735,788 B2
(45) Date of Patent: Aug. 15, 2017

(54) PHASE LOCKED LOOP FOR REDUCING FRACTIONAL SPUR NOISE

(71) Applicant: Electronics and Telecommunications Research Institute, Daejeon (KR)

(72) Inventors: Ja Yol Lee, Nonsan-si (KR); Minjae Lee, Gwangju (KR); Cheon Soo Kim, Daejeon (KR); Jaehyun Kang, Cheongju-si (KR); Junsoo Ko, Namyangju-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/185,438

(22) Filed: Jun. 17, 2016

(65) Prior Publication Data
US 2016/0373115 A1 Dec. 22, 2016

(30) Foreign Application Priority Data

Jun. 17, 2015 (KR) .................. 10-2015-0086013

(51) Int. Cl.
| | |
|---|---|
| *H03L 7/18* | (2006.01) |
| *H03L 1/00* | (2006.01) |
| *H03L 7/099* | (2006.01) |
| *H03L 7/093* | (2006.01) |
| *H03K 5/135* | (2006.01) |
| *H03K 5/00* | (2006.01) |

(52) U.S. Cl.
CPC ............... *H03L 1/00* (2013.01); *H03K 5/135* (2013.01); *H03L 7/093* (2013.01); *H03L 7/0991* (2013.01); *H03L 7/18* (2013.01); *H03K 2005/00052* (2013.01)

(58) Field of Classification Search
CPC ........................................................ H03L 7/18
See application file for complete search history.

(56) References Cited

U.S. PATENT DOCUMENTS

| | | | |
|---|---|---|---|
| 7,181,180 B1 * | 2/2007 | Teo ......................... | H03L 7/081 331/17 |
| 8,433,018 B2 | 4/2013 | Sidiropoulos et al. | |
| 8,433,020 B2 | 4/2013 | Buchwald et al. | |

(Continued)

OTHER PUBLICATIONS

Dong-Woo Jee et al., "A FIR-Embedded Phase Interpolator Based Noise Filtering for Wide-Bandwidth Fractional-N PLL", IEEE Journal of Solid-State Circuits, vol. 48, No. 11, pp. 2795-2804, Nov. 2013.

(Continued)

*Primary Examiner* — Hai L Nguyen
(74) *Attorney, Agent, or Firm* — Rabin & Berdo, P.C.

(57) ABSTRACT

Provided is a phase locked loop (PLL) that generates an output clock signal corresponding to a reference clock signal, the PLL including a first phase interpolator configured to generate a first interpolator clock signal that has a first time delay from the output clock signal and a second phase interpolator configured to generate a second interpolator clock signal that has a second time delay from the output clock signal. The PLL controls a frequency of the output clock signal based on a multiplexing the first interpolator clock signal and the second interpolator clock signal.

10 Claims, 7 Drawing Sheets

(56) References Cited

U.S. PATENT DOCUMENTS

| | | | |
|---|---|---|---|
| 8,437,726 B2 | 5/2013 | Kwon et al. | |
| 8,552,775 B2 | 10/2013 | Lee et al. | |
| 8,665,928 B1 * | 3/2014 | Klein | H04L 25/247 327/147 |
| 8,698,529 B2 | 4/2014 | Nam et al. | |
| 8,994,420 B2 * | 3/2015 | Eldredge | H03L 7/08 327/156 |

OTHER PUBLICATIONS

Roberto Nonis et al., "digPLL-Lite: A Low-Complexity, Low-Jitter Fractional-N Digital PLL Architecture", IEEE Journal of Solid-State Circuits, vol. 48, No. 12, pp. 3134-3145, Dec. 2013.

* cited by examiner

PHASE LOCKED LOOP FOR REDUCING FRACTIONAL SPUR NOISE

CROSS-REFERENCE TO RELATED APPLICATIONS

This U.S. non-provisional patent application claims priority under 35 U.S.C. §119 to Korean Patent Application No. 10-2015-0086013, filed on Jun. 17, 2015, the entire contents of which are hereby incorporated by reference.

BACKGROUND

The present disclosure herein relates to a phase locked loop (PLL), and more particularly to, a PLL for reducing fractional spur noise.

In recent, a charge pump and a phase locked loop (PLL) are being mostly used for implementing a radio frequency (RF) synthesizer for multi-band mobile communication. However, the charge pump PLL is integrated with an analog circuit design technology and needs, due to an analog circuit and analog signal characteristics, an extra analog RF library in addition to a design library that provides in a standard digital CMOS process. Thus, the charge pump PLL has a difficulty in integrating with a digital baseband signal processing block that uses a digital CMOS process. Also, the digital baseband signal processing block is being recently developed by a nano-scale digital CMOS process due to a development in process technology.

As such, with a development in nano technology, a digital circuit may easily adapt to a process technology to be manufactured in many cases even without re-designing, but the analog RF circuit has a limitation in that it needs to be re-designed each time the process technology varies. Also, with a nano-scale development in CMOS process technology, there is a drawback in that an operating voltage also decreases.

In the nano-scale digital CMOS process, a lot of time and a lot of costs are being consumed in order to improve many limitations that appear when designing the analog RF circuit. Thus, research and development in digital RF for gradually digitalizing the analog RF circuit block are being actively performed.

SUMMARY

The present disclosure provides a phase locked loop that reduces fractional spur noise when using phase interpolation.

An embodiment of the inventive concept provides a phase locked loop (PLL) that generates an output clock signal corresponding to a reference clock signal, the phase locked loop (PLL) including a first phase interpolator configured to generate a first interpolator clock signal that has a first time delay from the output clock signal; a second phase interpolator configured to generate a second interpolator clock signal that has a second time delay from the output clock signal; an interpolator controller configured to generate an interpolator control signal that enables one of the first and second interpolator clock signals to be selected in a specific ratio; a multiplexer configured to select one of the first and second interpolator clock signals according to the interpolator control signal; a divider configured to divide the selected one of the first and second interpolated clock signals to generate a divided clock signal; and a digitally controlled oscillator configured to control a frequency of the output clock signal corresponding to a phase difference between the reference clock signal and the divided clock signal.

In an embodiment, an error caused by the first time delay and an error caused by the second time delay may have a complementary size.

In an embodiment, the interpolator control signal may be generated to select one of the first and second interpolator clock signals in a different ratio.

In an embodiment, the interpolator control signal may be generated based on a pseudo random bit stream.

In an embodiment of the inventive concept, a phase locked loop (PLL) that generates an output clock signal corresponding to a reference clock signal includes a first phase interpolator configured to generate a first interpolator clock signal that has a first time delay or a second time delay from the output clock signal according to a first interpolator control signal; a second phase interpolator configured to generate a second interpolator clock signal that has the first time delay or the second time delay from the first interpolator clock signal according to a second interpolator control signal; an interpolator controller configured to generate the first interpolator control signal to generate the first interpolator clock signal according to one of the first and second time delays selected in a specific ratio, and generate the second interpolator control signal to generate the second interpolator clock signal according to another of the first and second time delays not selected; a divider configured to divide the second interpolator clock signal to generate a divided clock signal; and a digitally controlled oscillator configured to control a frequency of the output clock signal corresponding to a phase difference between the reference clock signal and the divided clock signal.

In an embodiment, an error caused by the first time delay and an error caused by the second time delay may have a complementary size.

In an embodiment, the first interpolator control signal may be generated to select one of the first and second time delays in a different ratio.

In an embodiment, the first and second interpolator control signals may be generated based on a pseudo random bit stream.

In an embodiment, the PLL may further include a sub divider that is configured to divide the first interpolator clock signal to generate a sub divided clock signal, wherein the second phase interpolator may be configured to generate the second interpolator clock signal that has the first time delay or the second time delay from the sub divided clock signal.

In an embodiment, the first phase interpolator may be configured to generate the first interpolator clock signal by multiplication of the selected one of the first and second time delays by a division ratio of the sub divider.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

It should be understood that both the foregoing general description and the following detailed description are exemplary, and it should be appreciated that the additional description of the claimed invention is provided. Reference numerals are denoted in detail in the exemplary embodiments of the inventive concept and their examples are indicated in the accompanying drawings. The same reference numerals are used in the description and drawings in order to refer to the same or similar parts wherever possible.

In the following, a phase locked loop (PLL) would be used as an example of a digital circuit for explaining the characteristics and functions of the inventive concept. However, a person skilled in the art would be able to easily understand other advantages and performance of the inventive concept based on the details described herein. Also, the inventive concept would be able to be implemented or applied through other embodiments. In addition, the detailed description may be modified or changed according to a viewpoint and an application without departing significantly from the scope, technical spirit and other purposes of the inventive concept.

Figure 1:
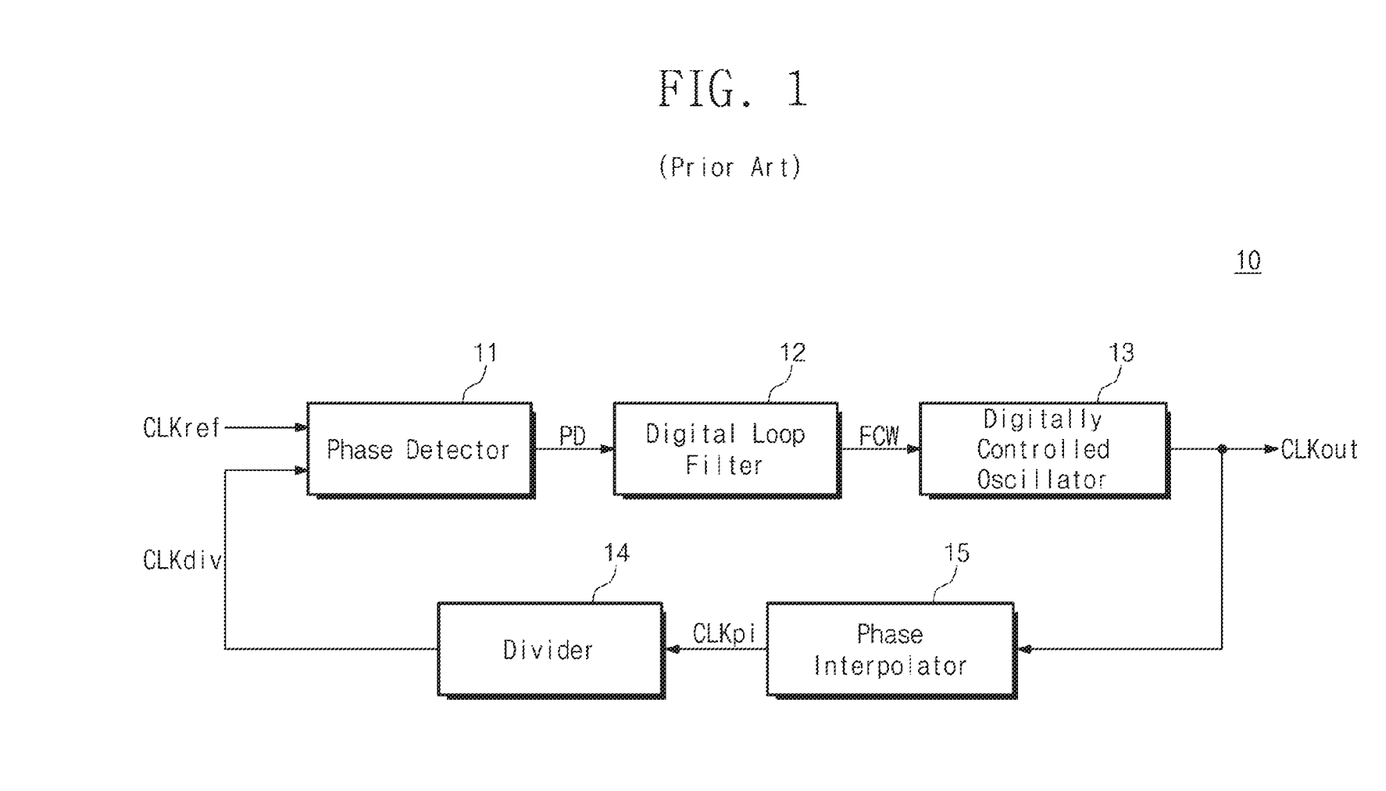
FIG. 1 is an exemplary block diagram of a general phase locked loop (PLL) that uses a phase interpolator.

FIG. 1 is an exemplary block diagram of a general PLL that uses a phase interpolator. A PLL 10 may include a phase detector 11, a digital loop filter 12, a digitally controlled oscillator 13, a divider 14, and a phase interpolator 15. The PLL 10 may compare the phases of a reference clock CLKref and a divided clock CLKdiv to lock the phase of an output clock CLKout.

The phase detector 11 may generate a phase detection signal PD that has a value corresponding to the phase difference between the reference clock CLKref and the divided clock CLKdiv. For example, the phase detection signal PD is a digital signal. The digital loop filter 12 may be implemented in a digital logic to function as a low pass filter. The digital loop filter 12 may output a frequency control word (FCW) for decreasing the phase difference between the reference clock CLKref and the divided clock CLKdiv based on the phase detection signal PD. For example, the frequency control word FCW is a digital signal. The digitally controlled oscillator 13 may control the frequency of the output clock CLKout according to the frequency control word FCW. For example, the digitally controlled oscillator 13 may control the output clock CLKout that has a frequency corresponding to the value of the frequency control word FCW. The divider 14 may divide an output signal from the phase interpolator 15 to generate the divided clock CLKdiv. The divider 14 may provide the divided clock CLKdiv to the phase detector 11. For example, the divided clock CLKdiv may be generated to have the same frequency as the reference clock CLKref.

The phase interpolator 15 may receive the output clock CLKout to perform interpolation on the output clock CLKout, and generate signals having changed phases by the interpolation. For example, the interpolation means dividing 360 degrees into a predetermined number of sub phases. The phase interpolator 15 may generate signals that correspond to the sub phases of the output clock CLKout. That is, the phase interpolator 15 may generate a signal delayed from the output clock CLKout that corresponds to a predetermined sub phase. When using the phase interpolator 15, the PLL 10 may reduce in-band phase noise. However, due to the usage of the phase interpolator 15, fractional spur noise may occur.

Figure 2:
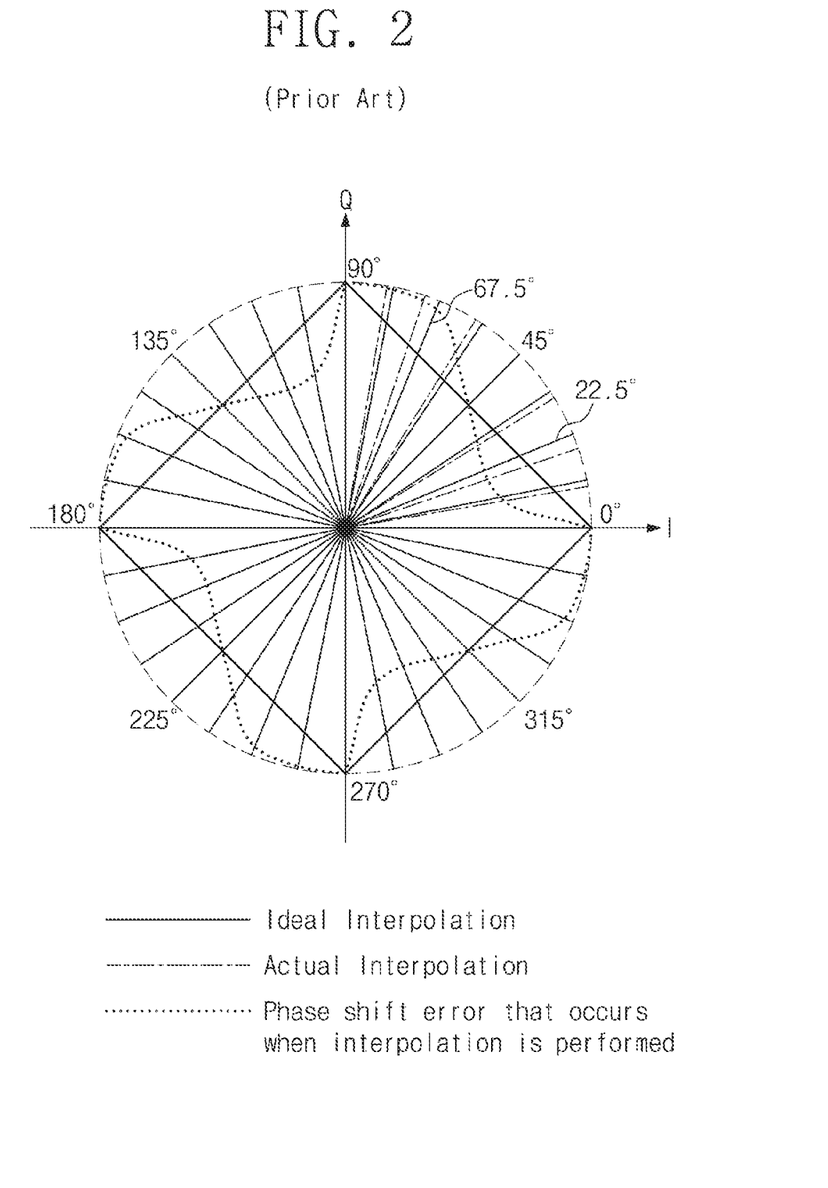
FIG. 2 illustrates interpolation that is performed by the interpolator in FIG. 1.

FIG. 2 illustrates interpolation that is performed by the interpolator in FIG. 1. Referring to FIG. 2, the interpolation means dividing the phase between vectors I and Q by a predetermined number. For example, 5-bit interpolation may divide the phase between 0 degrees and 360 degrees into 32 sub phases. In the following, the 5-bit interpolation is described as an example. However, the interpolation is not limited thereto. The interpolation may divide 360 degrees into any sub phases.

In FIG. 2, the case of ideal interpolation is indicated by a solid line. In the case of e.g., 5-bit interpolation, each sub phase may have phase shift at an interval of 11.25 degrees. However, in the case of actual interpolation, sub phases regularly have phase shift errors. The phase shift error means the difference between the sub phase of the ideal interpolation and the sub phase of actual interpolation corresponding thereto. In FIG. 2, the case of actual interpolation is indicated by an alternate long and short dash line.

In FIG. 2, the curve that is formed by dots indicates phase shift errors that each sub phase has when interpolation is performed. The phase shift error between 0 degrees and 90 degrees occurs by odd symmetry around 45 degrees. For example, in the case where the sub phase of the ideal interpolation is 45 degrees, the sub phase of the actual interpolation is 45 degrees and thus they match. In the case where the sub phase of the ideal interpolation is between 0 degrees and 90 degrees, the sub phase of the actual interpolation appears smaller than the sub phase of the ideal interpolation. In the case where the sub phase of the ideal interpolation is between 45 degrees and 90 degrees, the sub phase of the actual interpolation appears larger than the sub phase of the ideal interpolation. Also, the largest phase shift errors occur at 22.5 degrees and at 67.5 degrees.

In FIG. 2, the sub phases of the actual interpolation are indicated only between 0 degrees and 90 degrees. However, it would be understood that the sub phases of the actual interpolation are repeated between 90 degrees and 180 degrees, between 180 degrees and 270 degrees and between 270 degrees and 360 degrees in the same way as the pattern between 0 degrees and 90 degrees. Thus, the phase shift errors are also repeated on the remaining quadrants in the same way as the pattern between 0 degrees and 90 degrees. Due to these phase shift errors, the PLL 10 in FIG. 1 may have fractional spur noise.

Figure 3:
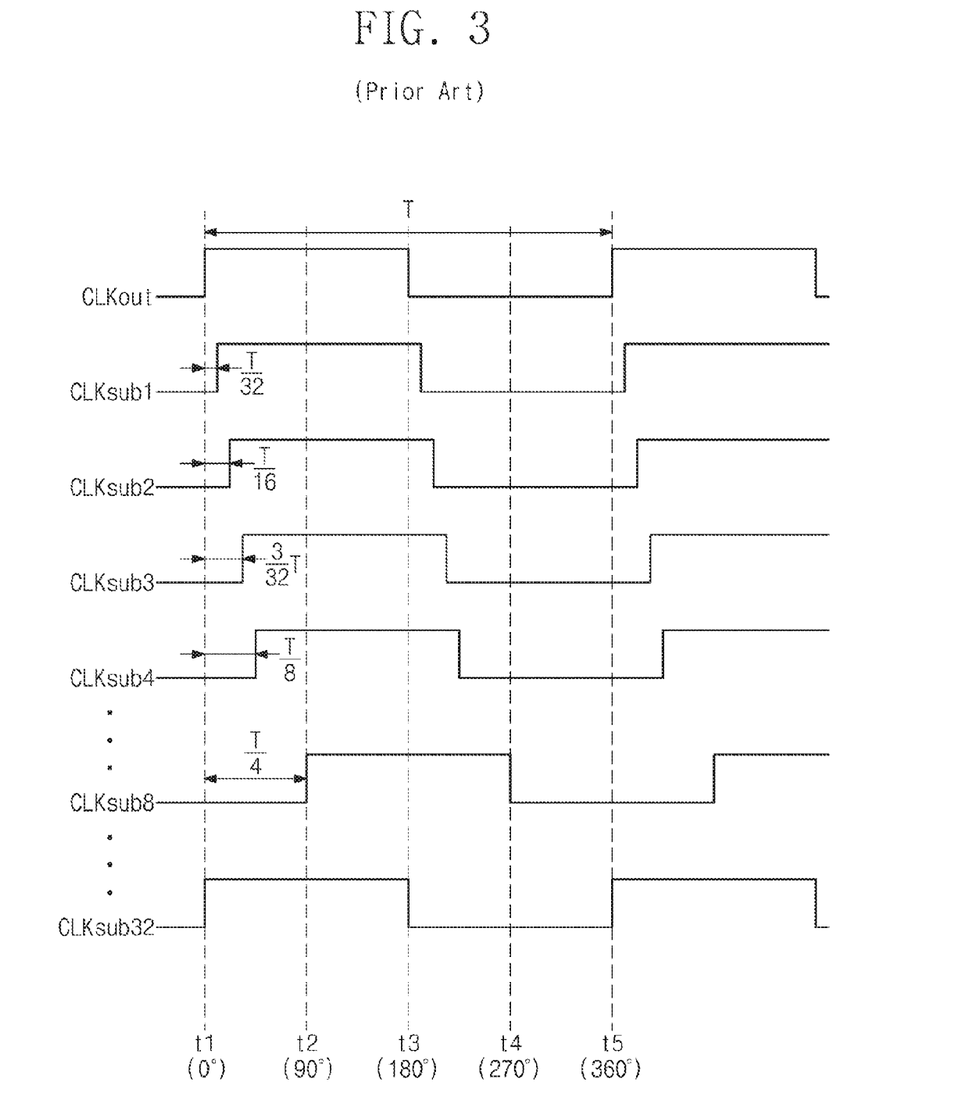
FIG. 3 is a timing diagram for the interpolation in FIG. 2.

FIG. 3 is a timing diagram for the interpolation in FIG. 2. Referring to FIGS. 1 to 3, it is assumed that the period of the output clock CLKout is time T. Sub clocks CLKsub1 to CLKsub32 are signals that correspond to the sub phases of the interpolation in FIG. 2. The interpolation means generating the sub clocks CLKsub1 to CLKsub32 that are obtained by the delaying of the output clock CLKout. If in the case of e.g., 5-bit interpolation, interpolation is performed, it is possible to generate 32 sub clocks CLKsub1 to CLKsub32 that have a phase difference by time T/32. The first sub clock CLKsub1 may correspond to a sub phase of 11.25 degrees in FIG. 2. The second sub clock CLKsub2 may correspond to a sub phase of 22.5 degrees in FIG. 2. As such, the remaining sub clocks CLKsub3 to CLKsub32 may correspond to the sub phases in FIG. 2. The phase interpolator 15 may sequentially output the sub clocks CLKsub1 to CLKsub32 in a predetermined order. The timing diagram in FIG. 3 corresponds to the ideal interpolation in FIG. 2. Thus, according to the actual interpolation, the phase interpolator 15 would output signals that have phases changed by phase shift errors from the sub clocks CLKsub1 to CLKsub32 in FIG. 3.

Figure 4:
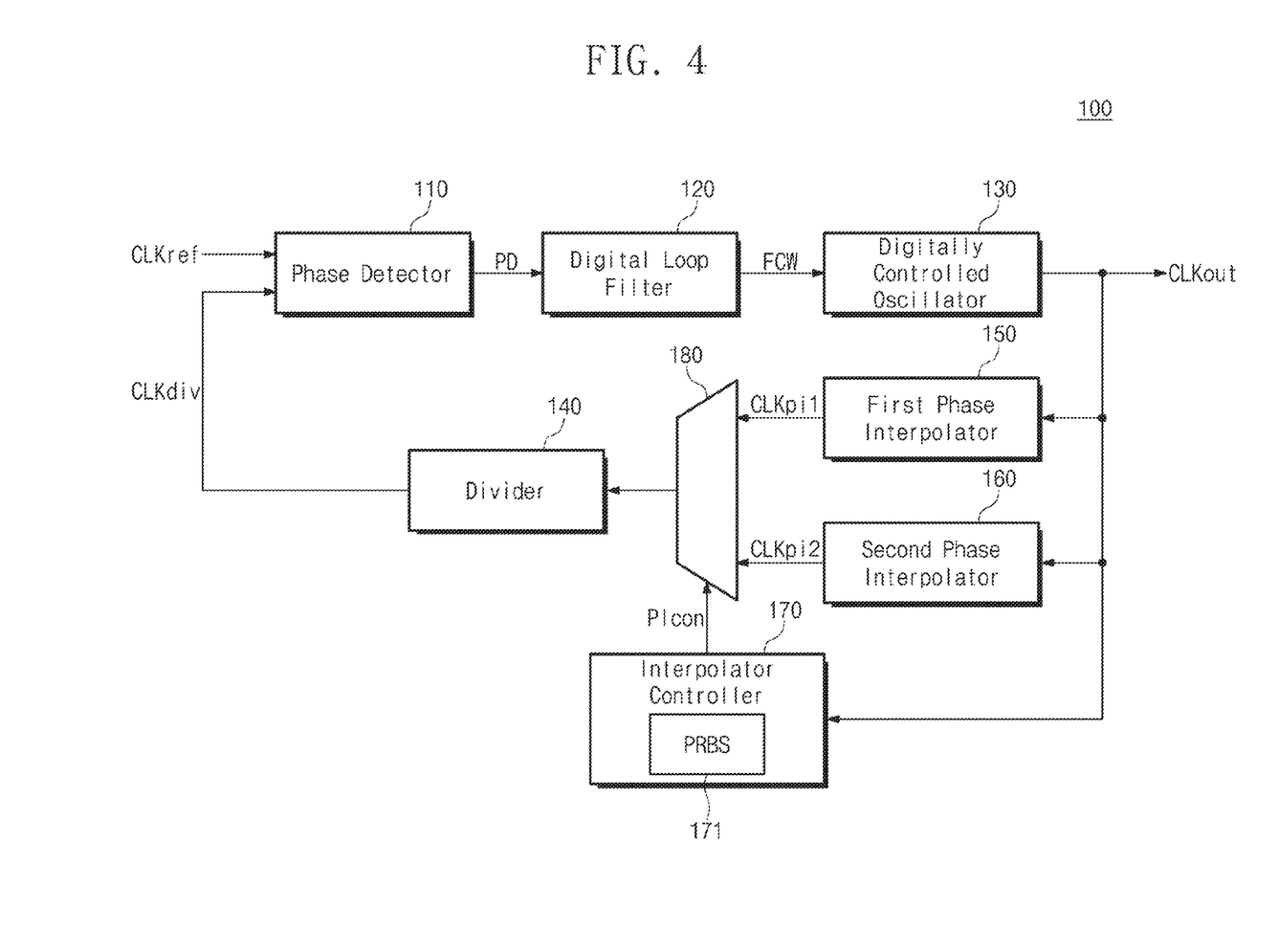
FIG. 4 is a block diagram of a PLL according to an embodiment of the inventive concept.
Figure 5:
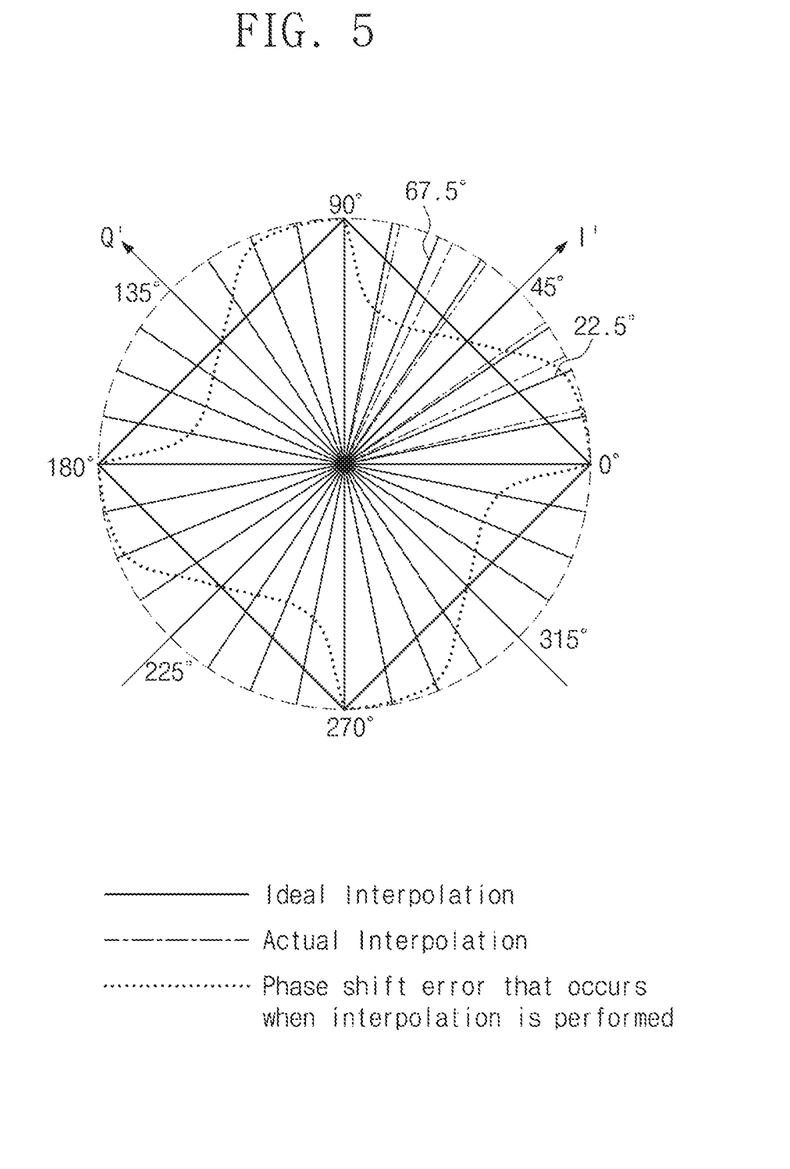
FIG. 5 illustrates interpolation that is performed by a second phase interpolator in FIG. 4.

FIG. 4 is a block diagram of a PLL according to an embodiment of the inventive concept. FIG. 5 illustrates interpolation that is performed by a second phase interpolator in FIG. 4. Referring to FIGS. 4 and 5, a PLL 100 may include a phase detector 110, a digital loop filter 120, a digitally controlled oscillator 130, a divider 140, first and second phase interpolators 150 and 160, an interpolator controller 170, and a multiplexer 180. The PLL 100 may compare the phases of a reference clock CLKref and a divided clock CLKdiv to lock the phase of an output clock CLKout. Also, the PLL 100 may reduce fractional spur noise through the first and second phase interpolators 150 and 160 that perform different interpolations.

The first phase interpolator 150 may perform predetermined interpolation to generate sub clocks that are obtained by the changing of the phase of the output clock CLKout. For example, the first phase interpolator 150 may perform the interpolation that has been described in FIG. 2. The first phase interpolator 150 may perform interpolation on the output clock CLKout to output a first displacement clock CLKpi1.

The second phase interpolator 160 may perform different interpolation from the first phase interpolator 150. For example, the second phase interpolator 160 perform interpolation that divides the phases of vectors I' and Q' in FIG. 5 by a predetermined number. The second phase interpolator 160 may perform interpolation on the output clock CLKout to output a second displacement clock CLKpi2.

Here, the interpolation in FIG. 5 may be performed on the I' axis and the Q' axis that are obtained by rotating the I axis and the Q axis in FIG. 2 by 45 degrees counterclockwise. In FIG. 5, the curve that is formed by dots indicates phase shift errors that each sub phase has when interpolation is performed.

The phase shift error in FIG. 5 may occur by odd symmetry that is complementary to the phase shift error in FIG. 2. For example, in the case where the sub phase of the ideal interpolation in FIG. 5 is 45 degrees, the sub phase of the actual interpolation is 45 degrees and thus they match. In the case where the sub phase of the ideal interpolation is between 0 degrees and 45 degrees, the sub phase of the actual interpolation appears larger than the sub phase of the ideal interpolation. In the case where the sub phase of the ideal interpolation is between 45 degree and 90 degrees, the sub phase of the actual interpolation appears smaller than the sub phase of the ideal interpolation. Also, the largest phase shift errors occur at 22.5 degrees and at 67.5 degrees.

Referring back to FIG. 4, the multiplexer 180 may receive the first displacement clock CLKpi1 and the second displacement clock CLKpi2 to output a signal that is selected from them. The multiplexer 180 may select one of the first displacement clock CLKpi1 and the second displacement clock CLKpi2 according to an interpolator control signal PIcon.

The interpolator controller 170 may generate the interpolator control signal PIcon that controls the multiplexer 180. The interpolator control signal PIcon may be generated to arbitrarily select one of the first displacement clock CLKpi1 and the second displacement clock CLKpi2. For example, the interpolator control signal PIcon may be generated by a pseudo random bit stream generator 171 in the interpolator controller 170.

The divider 140 may receive one of the first displacement clock CLKpi1 and the second displacement clock CLKpi2 from the multiplexer 180. The divider 140 may divide a clock signal to be received by a predetermined value to generate the divided clock CLKdiv.

The phase detector 110 may generate a phase detection signal PD that has a value corresponding to the phase difference between the reference clock CLKref and the divided clock CLKdiv. For example, the phase detection signal PD is a digital signal. The digital loop filter 120 may be implemented in a digital logic to function as a low pass filter. The digital loop filter 120 may output a frequency control word (FCW) for decreasing the phase difference between the reference clock CLKref and the divided clock CLKdiv based on the phase detection signal PD. For example, the frequency control word FCW is a digital signal. The digitally controlled oscillator 130 may control the frequency of the output clock CLKout according to the frequency control word FCW. For example, the digitally controlled oscillator 130 may control the output clock CLKout that has a frequency corresponding to the value of the frequency control word FCW.

The PLL 100 according to the inventive concept may select, in any order, the first and second displacement clocks CLKpi1 and CLKpi2 of the first and second phase interpolators 150 and 160 that include complementary phase shift errors. Thus, the phase shift errors that are caused by the first and second phase interpolators 150 and 160 may be cancelled each other. As a result, the PLL 100 may reduce fractional spur noise.

Figure 6:
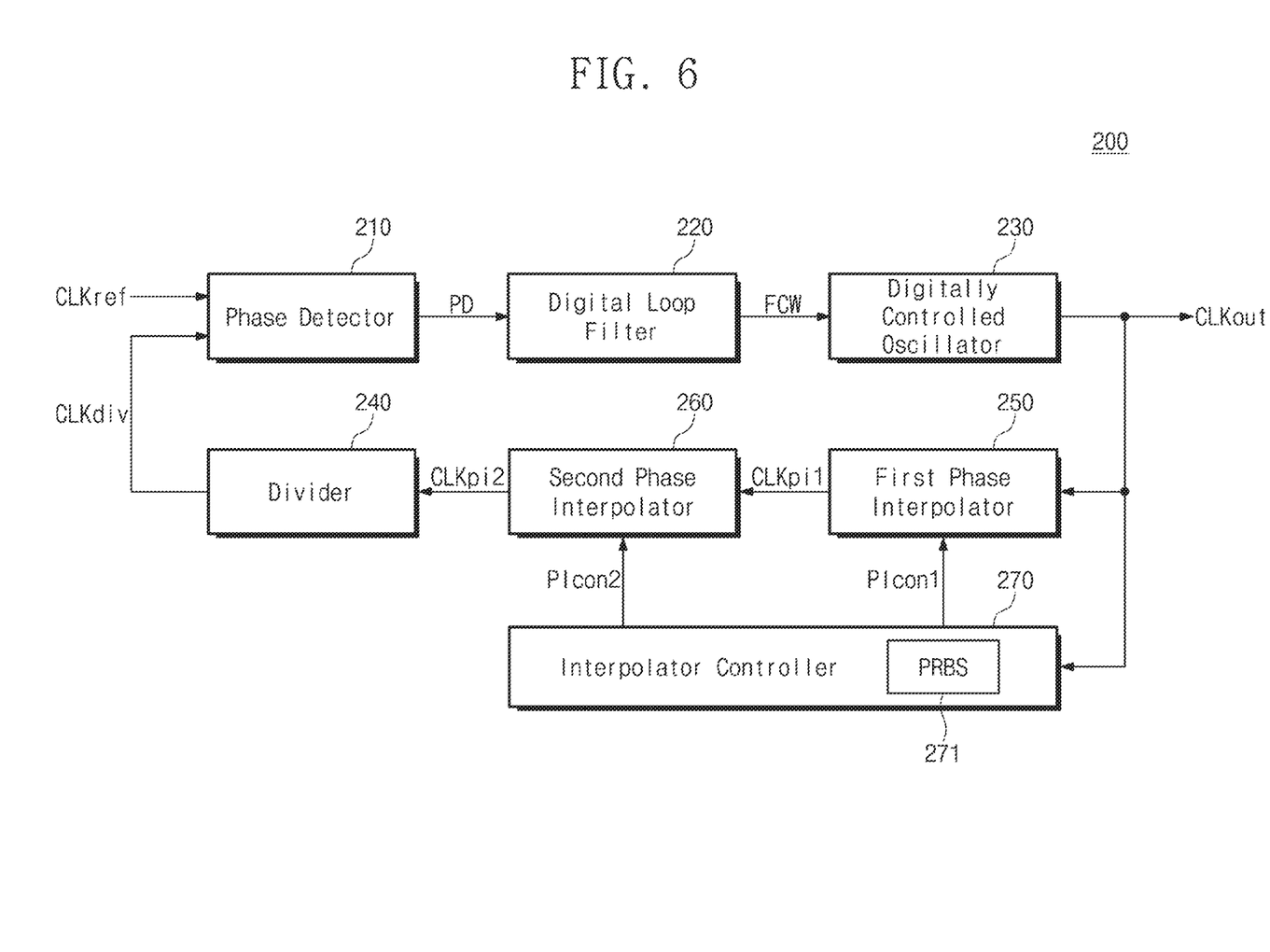
FIG. 6 is a block diagram of a PLL according to another embodiment of the inventive concept.

FIG. 6 is a block diagram of a PLL according to another embodiment of the inventive concept. Referring to FIG. 6, a second phase interpolator 260 may receive a first displacement clock CLKpi1 from a first phase interpolator 250. The first and second phase interpolators 250 and 260 may perform different interpolations. An interpolator controller 270 may generate first and second interpolator control signals PIcon1 and PIcon2. For example, the first and second phase interpolators 250 and 260 may perform complementary interpolations each other according to the first and second interpolator control signals PIcon1 and PIcon2.

The first phase interpolator 250 may receive the output clock CLKout to perform the interpolation in FIG. 2 or 5 according to the first interpolator control signal PIcon1. For example, the first interpolator control signal PIcon1 may be generated by a pseudo random bit stream generator 271 in the interpolator controller 270. The first interpolator control signal PIcon1 may be generated to select one of the interpolations in FIGS. 2 and 5 in any order. The first phase interpolator 250 may perform one of the interpolations in FIGS. 2 and 5 in any order based on the first interpolator control signal PIcon1.

The second phase interpolator 260 may receive the first displacement clock CLKpi1 to perform the interpolation in FIG. 2 or 5 according to the second interpolator control signal PIcon2. For example, the second interpolator control signal PIcon2 may be generated so that interpolation complementary to the first phase interpolator 250 is performed by the second phase interpolator 260. Thus, in the case where the interpolation in FIG. 2 is performed by the first phase interpolator 250, the second phase interpolator 260 may perform the interpolation in FIG. 5. In the case where the interpolation in FIG. 5 is performed by the first phase interpolator 250, the second phase interpolator 260 may perform the interpolation in FIG. 2. The second phase interpolator 260 may perform the interpolation in FIG. 2 or 5 in any order that is determined by the pseudo random bit stream generator 271.

A divider 240 may divide the second displacement clock CLKpi2 by a predetermined value to generate the divided clock CLKdiv. For example, the second displacement clock CLKpi2 is a signal on which both the interpolations in FIGS. 2 and 5 are performed.

Since the operations of the phase detector 210, the digital loop filter 220, and the digitally controlled oscillator 230 are the same or similar to those described in FIG. 4, their descriptions are omitted. The PLL 200 according to the inventive concept may perform, in any order, both the interpolations in FIGS. 2 and 5 that include complementary phase shift errors. For example, the PLL 200 may perform the interpolation in FIG. 2 and then perform the interpolation in FIG. 5. Alternatively, the PLL 200 may perform the interpolation in FIG. 5 and then perform the interpolation in FIG. 2. Thus, the phase shift errors that are caused by the interpolations in FIGS. 2 and 5 may be cancelled each other. As a result, the PLL 200 may reduce fractional spur noise.

Figure 7:
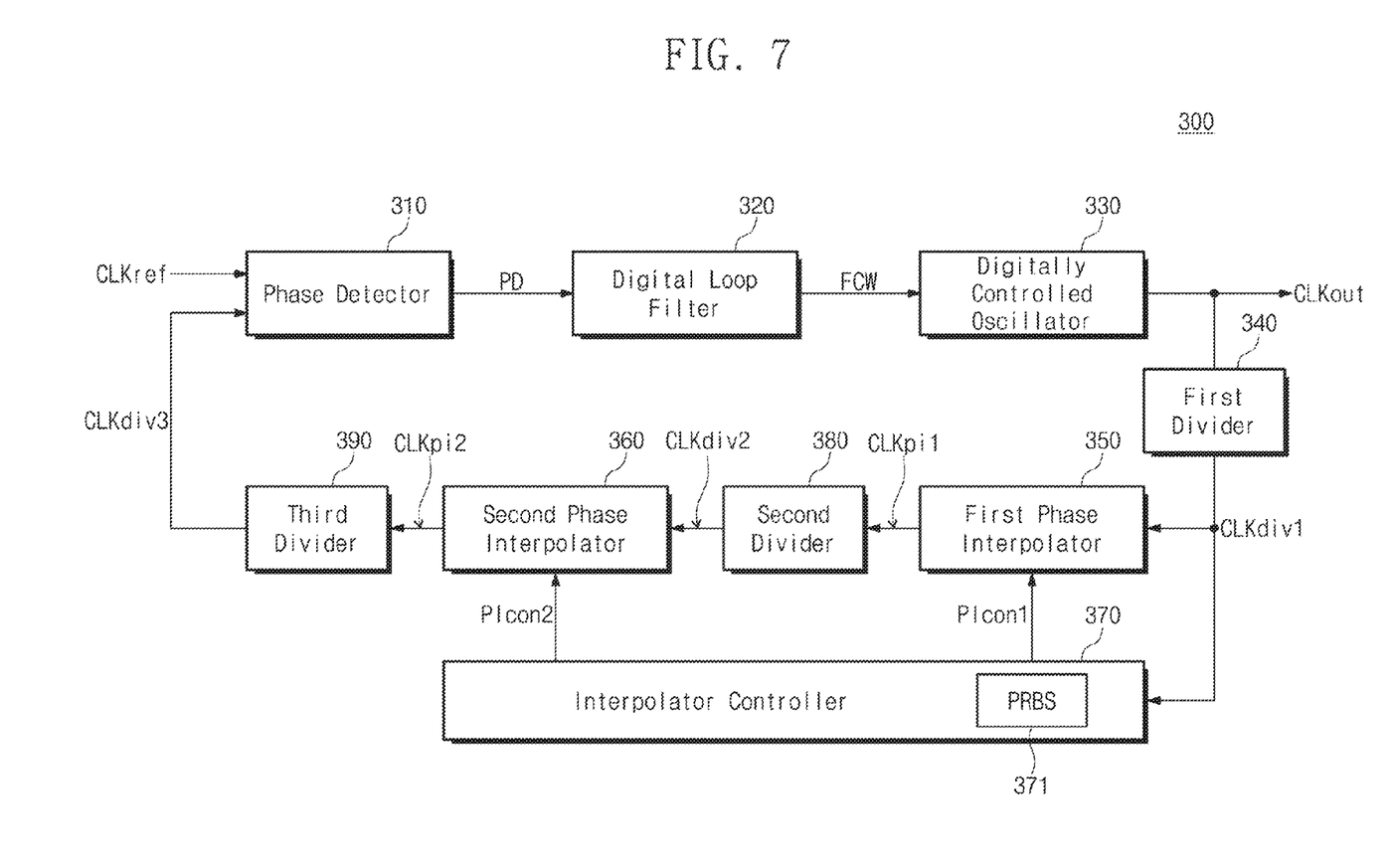
FIG. 7 is a block diagram of a PLL according to another embodiment of the inventive concept.

FIG. 7 is a block diagram of a PLL according to another embodiment of the inventive concept. Referring to FIG. 7, first and second phase interpolators 350 and 360 may receive different frequency clock signals. The first and second phase interpolators 350 and 360 may perform different interpolations. An interpolator controller 370 may generate first and second interpolator control signals PIcon1 and PIcon2. For example, the first and second phase interpolators 350 and 2560 may perform complementary interpolations according to the first and second interpolator control signals PIcon1 and PIcon2.

A first divider 340 may divide an output clock CLKout to generate a first divided clock CLKdiv1. For example, in the case of the division ration of the first divider 340 is 2 and the frequency of the output clock CLKout is about 4 GHz, the frequency of the first divided clock CLKdiv1 is about 2 GHz.

The first phase interpolator 350 may receive the first divided clock CLKdiv1 to perform the interpolation in FIG. 2 or 5 according to the first interpolator control signal PIcon1. For example, the first interpolator control signal PIcon1 may be generated by a pseudo random bit stream 371 in the interpolator controller 370. The first interpolator control signal PIcon1 may be generated to select one of the interpolations in FIGS. 2 and 5 in any order. The first phase interpolator 350 may perform one of the interpolations in FIGS. 2 and 5 in any order based on the first interpolator control signal PIcon1.

A second divider 380 may divide a first displacement clock CLKpi1 to generate a second divided clock CLKdiv2. For example, in the case of the division ration of the second divider 380 is 2 and the frequency of the first displacement clock CLKpi1 is about 2 GHz, the frequency of the second divided clock CLKdiv2 is about 1 GHz.

The second phase interpolator 360 may receive the second divided clock CLKdiv2 to perform the interpolation in FIG. 2 or 5 according to the second interpolator control signal PIcon2. For example, the second interpolator control signal PIcon2 may be generated so that interpolation complementary to the first phase interpolator 350 is performed by the second phase interpolator 360. Thus, in the case where the interpolation in FIG. 2 is performed by the first phase interpolator 350, the second phase interpolator 360 may perform the interpolation in FIG. 5. In the case where the interpolation in FIG. 5 is performed by the first phase interpolator 350, the second phase interpolator 360 may perform the interpolation in FIG. 2. The second phase interpolator 360 may perform the interpolation in FIG. 2 or 5 in any order that is determined by the pseudo random bit stream 371.

Here, the frequencies of the first displacement clock CLKpi1 and the second displacement clock CLKpi2 that are input to the first phase interpolator 350 and the second phase interpolator 360 are different from each other. Thus, a practical phase variation at the second phase interpolator 360 may be larger by the division ratio of the second divider 380 than a practical phase variation at the first phase interpolator 350. Thus, the first phase interpolator 350 may be controlled to change a phase larger by the division ratio of the second divider 380.

A third divider 390 may divide the second displacement clock CLKpi2 by a predetermined value to generate a third divided clock CLKdiv3. For example, the second displacement clock CLKpi2 is a signal on which both the interpolations in FIGS. 2 and 5 are performed.

Since the operations of a phase detector 310, a digital loop filter 320, and a digitally controlled oscillator 330 are the same or similar to those described in FIG. 4, their descriptions are omitted.

The PLL 300 according to the inventive concept may perform, in any order, both the interpolations in FIGS. 2 and 5 that include complementary phase shift errors. For example, the PLL 300 may perform the interpolation in FIG. 2 and then perform the interpolation in FIG. 5. Alternatively, the PLL 300 may perform the interpolation in FIG. 5 and then perform the interpolation in FIG. 2. Thus, the phase shift errors that are caused by the interpolations in FIGS. 2 and 5 may be cancelled each other. As a result, the PLL 300 may reduce fractional spur noise.

According to embodiments of the inventive concept, it is possible to provide a PLL that uses additional phase interpolators generating different phase shift errors from a fundamental phase interpolator to reduce fractional spur noise.

As described above, optimal embodiments are disclosed through the drawings and the present disclosure. Although specific terms are used herein, they are only used for describing the inventive concept and not for limiting meanings or the scope of the inventive concept disclosed in the following claims. Therefore, a person skilled in the art would understand that it is possible to implement various variations and equivalents. Thus, the true technical protective scope of the inventive concept would be defined by the technical spirit of the following claims.

What is claimed is:

1. A phase locked loop (PLL) that generates an output clock signal corresponding to a reference clock signal, the phase locked loop (PLL) comprising:
    a first phase interpolator configured to generate a first interpolator clock signal that has a first time delay from the output clock signal;
    a second phase interpolator configured to generate a second interpolator clock signal that has a second time delay from the output clock signal;
    an interpolator controller configured to generate an interpolator control signal that enables one of the first and second interpolator clock signals to be selected in a specific ratio;
    a multiplexer configured to select one of the first and second interpolator clock signals according to the interpolator control signal;
    a divider configured to divide the selected one of the first and second interpolated clock signals to generate a divided clock signal; and a digitally controlled oscillator configured to control a frequency of the output clock signal corresponding to a phase difference between the reference clock signal and the divided clock signal.

2. The phase locked loop (PLL) of claim 1, wherein an error caused by the first time delay and an error caused by the second time delay have a complementary size.

3. The phase locked loop (PLL) of claim 1, wherein the interpolator control signal is generated to select one of the first and second interpolator clock signals in a different ratio.

4. The phase locked loop (PLL) of claim 1, wherein the interpolator control signal is generated based on a pseudo random bit stream.

5. A phase locked loop (PLL) that generates an output clock signal corresponding to a reference clock signal, the phase locked loop (PLL) comprising:
- a first phase interpolator configured to generate a first interpolator clock signal that has a first time delay or a second time delay from the output clock signal according to a first interpolator control signal;
- a second phase interpolator configured to generate a second interpolator clock signal that has the first time delay or the second time delay from the first interpolator clock signal according to a second interpolator control signal;
- an interpolator controller configured to generate the first interpolator control signal to generate the first interpolator clock signal according to one of the first and second time delays selected in a specific ratio, and generate the second interpolator control signal to generate the second interpolator clock signal according to another of the first and second time delays not selected;
- a divider configured to divide the second interpolator clock signal to generate a divided clock signal; and
- a digitally controlled oscillator configured to control a frequency of the output clock signal corresponding to a phase difference between the reference clock signal and the divided clock signal.

6. The phase locked loop (PLL) of claim 5, wherein an error caused by the first time delay and an error caused based on the second time delay have a complementary size.

7. The phase locked loop (PLL) of claim 5, wherein the first interpolator control signal is generated to select one of the first and second time delays in a different ratio.

8. The phase locked loop (PLL) of claim 5, wherein the first and second interpolator control signals are generated by a pseudo random bit stream.

9. The phase locked loop (PLL) of claim 5, further comprising a sub divider that is configured to divide the first interpolator clock signal to generate a sub divided clock signal,
  wherein the second phase interpolator is configured to generate the second interpolator clock signal that has the first time delay or the second time delay from the sub divided clock signal.

10. The phase locked loop (PLL) of claim 9, wherein the first phase interpolator is configured to generate the first interpolator clock signal by multiplication of the selected one of the first and second time delays by a division ratio of the sub divider.

* * * * *